(12) United States Patent
Lee et al.

(10) Patent No.: US 8,058,658 B2
(45) Date of Patent: Nov. 15, 2011

(54) HIGH-SPEED OPTICAL INTERCONNECTION DEVICE

(75) Inventors: Sang-Heung Lee, Daejeon (KR); Hae Cheon Kim, Daejeon (KR); Dong Min Kang, Daejeon (KR); Dong-Young Kim, Daejeon (KR); Jae Kyoung Mun, Daejeon (KR); Hokyun Ahn, Daejeon (KR); Jong-Won Lim, Daejeon (KR); Woo Jin Chang, Daejeon (KR); Hong Gu Ji, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 78 days.

(21) Appl. No.: 12/421,130

(22) Filed: Apr. 9, 2009

(65) Prior Publication Data

US 2010/0133551 A1 Jun. 3, 2010

(30) Foreign Application Priority Data

Nov. 29, 2008 (KR) .......................... 10-2008-0120192

(51) Int. Cl.
*H01L 27/15* (2006.01)
(52) U.S. Cl. ................. 257/84; 257/98; 257/99; 257/85; 257/100
(58) Field of Classification Search .................... 257/84, 257/99, 100
See application file for complete search history.

(56) References Cited

U.S. PATENT DOCUMENTS

| 6,132,107 | A | * | 10/2000 | Morikawa | 385/89 |
| 6,864,509 | B2 | | 3/2005 | Worley | |
| 6,868,214 | B1 | * | 3/2005 | Sakata et al. | 385/129 |
| 2003/0156778 | A1 | * | 8/2003 | Laval et al. | 385/14 |
| 2004/0253782 | A1 | * | 12/2004 | Kondo | 438/222 |
| 2005/0017257 | A1 | * | 1/2005 | Green et al. | 257/98 |

FOREIGN PATENT DOCUMENTS

| JP | 2005-148129 | | 6/2005 |
| JP | 2006-023579 | | 1/2006 |
| JP | 2007-036019 | | 2/2007 |
| KR | 2002-0012945 | * | 2/2002 |

OTHER PUBLICATIONS

Machine translation of KR2002-0012945 has been attached.*

* cited by examiner

*Primary Examiner* — Wai Sing Louie
*Assistant Examiner* — Bilkis Jahan
(74) *Attorney, Agent, or Firm* — Rabin & Berdo, P.C.

(57) ABSTRACT

Provided is a high-speed optical interconnection device. The high-speed optical interconnection device includes a first semiconductor chip, light emitters, optical detectors, and a second semiconductor chip, which are disposed on a silicon-on-insulator (SOI) substrate. The light emitters receive electrical signals from the first semiconductor chip to output optical signals. The optical detectors detect the optical signals to convert the optical signals into electrical signals. The second semiconductor chip receives the electrical signals converted by the optical detectors.

10 Claims, 2 Drawing Sheets

HIGH-SPEED OPTICAL INTERCONNECTION DEVICE

CROSS-REFERENCE TO RELATED APPLICATIONS

This U.S. non-provisional patent application claims priority under 35 U.S.C. §119 of Korean Patent Application No. 10-2008-0120192, filed on Nov. 29, 2008, the entire contents of which are hereby incorporated by reference.

BACKGROUND

The present invention disclosed herein relates to a high-speed optical interconnection device, and more particularly, to a high-speed optical interconnection device with high reliability that includes multi-channels.

In line with the development of fabrication technology of a semiconductor device having a sub-micron linewidth, many chips with a very high clock rate of 1 GHz or more have been developed. However, each device on ultra large scale integration (ULSI) chips has a limited operating speed due to a delay in a data transmission rate at interconnections between the devices. The delay in the transmission rate due to the interconnections become more and more serious as a data connection distance between apparatuses, between boards, or between chips gets farther and farther. In particular, according to an increase in the integration degree of a system on chip (SoC) and an increase in a chip size, a contact resistance between a semiconductor and a metal interconnection increases exponentially, and a metal interconnection's own resistance, an inductance, and a signal interference between the interconnections also increases. This has an adverse effect on transmission time delays inside an IC chip of several tens of GHz or more and between the chips, and also brings about a signal distortion. Therefore, it is necessary to convert an electrical signal into an optical signal and transmit the converted optical signal.

Accordingly, studies are recently being conducted on a technology of using an optical interconnection instead of a metal interconnection as an interconnection between devices. An optical interconnection device including devices connected through the optical interconnection provides several advantages such as high bandwidth for data transmission, low crosstalk between channels, low electromagnetic interference (EMI), good parallel processing function, high interconnection density, fan-in and fan-out of many channels, low device power, small signal delay, and low noise current through grounding.

SUMMARY

The present invention provides a high-speed optical interconnection device with improved performance.

Embodiments of the present invention provide high-speed optical interconnection devices including: a first semiconductor chip on a silicon-on-insulator (SOI) substrate; a light emitter on the SOI substrate, the light emitter receiving electrical signal from the first semiconductor chip to output optical signal; an optical detector on the SOI substrate, the optical detector detecting the optical signal to convert the optical signal into the electrical signal; and a second semiconductor chip on the SOI substrate, the second semiconductor chip receiving the electrical signal converted by the optical detector.

In some embodiments, the SOI substrate may include: a first SOI substrate on which the first semiconductor chip and the light emitter are disposed; and a second SOI substrate on which the second semiconductor chip and the optical detector are disposed, wherein the first and second SOI substrates are spaced apart from each other.

In other embodiments, the high-speed optical interconnection devices may further include a circuit board on which the first and second SOI substrates are placed.

In still other embodiments, the light emitter may include an intermediate layer on the SOI substrate, and a III-V compound semiconductor layer, wherein a lattice constant of the intermediate layer is greater than a lattice constant of an SOI layer of the SOI substrate and smaller than a lattice constant of the group III-V compound semiconductor layer.

In even other embodiments, the intermediate layer may include a silicon-germanium layer.

In yet other embodiments, the high-speed optical interconnection devices may further include channel fiber transmitting the optical signal from the light emitter to the optical detector.

In further embodiments, the first semiconductor chip may include a silicon-germanium bipolar transistor or a silicon bipolar transistor.

In still further embodiments, the light emitter may include a light-emitting diode (LED).

In even further embodiments, the high-speed optical interconnection devices may include: a hologram optical substrate disposed on the light emitter; and a mirror plate disposed on the hologram optical substrate.

In yet further embodiments, the hologram optical substrate may include a hologram transmitter configured to generate hologram using the optical signal output from the light emitter.

In other embodiments, the optical detector may include one of a silicon-germanium positive intrinsic negative (PIN) photodiode, a silicon-germanium photodiode, a silicon photodiode, and a germanium photodiode.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
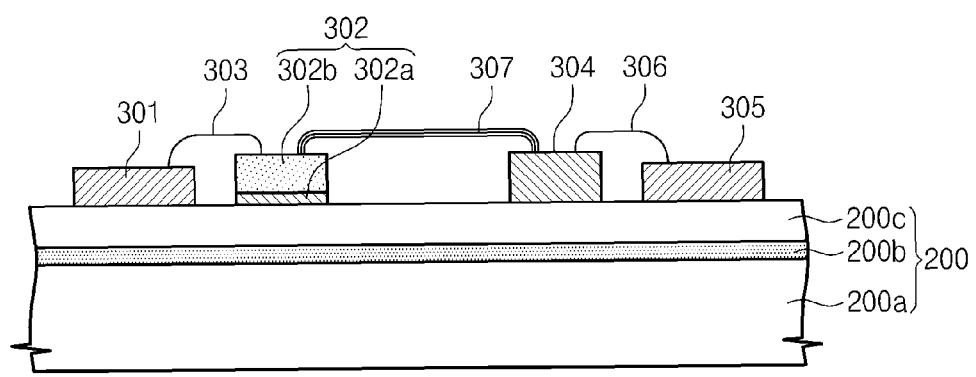
FIG. 1 is a schematic sectional view of a high-speed optical interconnection device according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements, these elements should not be limited by these terms. These terms are used only to discriminate one element from another element.

In the drawings, the dimensions of layers and regions are exaggerated for clarity of illustration. Like reference numerals refer to like elements throughout.

Meanwhile, for simplicity in description, several embodiments adopting the technical idea of the present invention will be exemplarily illustrated below, and description for various modified embodiments will be omitted herein. However, a person of ordinary skill in the art can fully modify and apply the various cases adopting the technical idea of the present invention based on the detailed description and the exemplary embodiments.

FIG. 1 is a schematic sectional view of a high-speed optical interconnection device according to an embodiment of the present invention.

Referring to FIG. 1, a first semiconductor chip 301 is disposed on a silicon-on-insulator (SOI) substrate 200. The SOI substrate 200 includes a substrate 200a, an insulation layer 200b and a SOI layer 200c, which are stacked in sequence. The SOI substrate 200 can minimize performance degradation caused by a parasitic component of a silicon substrate. For example, the SOI substrate 200 can minimize a parasitic capacitance and reduce power consumption. The insulation layer 200b may be a silicon oxide layer.

A light emitter 302 is disposed on the SOI substrate 200, and receives electrical signal from the first semiconductor chip 301 to output optical signal. The light emitter 302 may receive the electrical signal from the first semiconductor chip 301 through a first electrical interconnection 303. The light emitter 302 may be a plurality of light emitter. The first electrical interconnection 303 may be a plurality of electrical interconnection line. The light emitter 302 may be spaced apart from the first semiconductor chip 301.

The light emitter 302 may be a light-emitting diode (LED). The first semiconductor chip 301 may include a silicon-germanium bipolar transistor or a silicon bipolar transistor. The silicon-germanium bipolar transistor or silicon bipolar transistor has excellent drivability so that it may serve as a driving circuit of the light emitter 302. That is, the silicon-germanium bipolar transistor or silicon bipolar transistor may act as a driving element of the light emitter 302 for outputting optical signal, and particularly, it may act as a driving element of an LED because of its high driving current. The silicon-germanium bipolar transistor or the silicon bipolar transistor may be a plurality of transistor.

An optical detector 304 is disposed on the SOI substrate 200, and receives the optical signal through a channel fiber 307, which is output from the light emitter 302. The optical detector 304 may convert the optical signal into the electrical signal. The channel fiber 307 can transmit a optical signal. The channel fiber 307 may transmit a plurality of optical signals at a time. The channel fiber 307 may use an optical fiber made of glass or silicon.

A second semiconductor chip 305 is provided to receive the electrical signal from the optical detector 304. The second semiconductor chip 305 can receive the electrical signal from the optical detector 304 through a second electrical interconnection 306. The optical detector 304 may be a plurality of optical detector. The second electrical interconnection 306 may be a plurality of electrical interconnection line. The plurality of optical detector 304 can receive the multi-optical signals from the plurality of light emitter 302 through the multi-channel fiber 307. The second semiconductor chip 305 may be spaced apart from the optical detector 304.

The light emitter 302 includes an intermediate layer 302a and a III-V compound semiconductor layer 302b on the intermediate layer 302a. A lattice constant of the intermediate layer 302a is greater than a lattice constant of the SOI layer 200c of the SOI substrate 200, and smaller than a lattice constant of the III-V compound semiconductor layer 302b. For example, if a lattice constant of silicon in the SOI layer 200c of the SOI substrate 200 is about 5.43 Å, and a lattice constant of gallium arsenide (GaAs) in the group III-V compound semiconductor layer 302b is about 5.65 Å, a lattice constant of the intermediate layer 302a may be an intermediate value between them. The intermediate layer 302a is provided for minimizing a strain due to the lattice mismatch between the SOI substrate 200 and the III-V compound semiconductor layer 302b. The intermediate layer 302a may be a silicon-germanium layer. The intermediate layer 302a can minimize a lattice defect.

The optical detector 304 may include one of a silicon-germanium positive intrinsic negative (PIN) photodiode, a silicon-germanium photodiode, a silicon photodiode, and a germanium photodiode. Accordingly, it is possible to minimize a lattice defect between the optical detector 304 and the SOI substrate 200.

Figure 2:
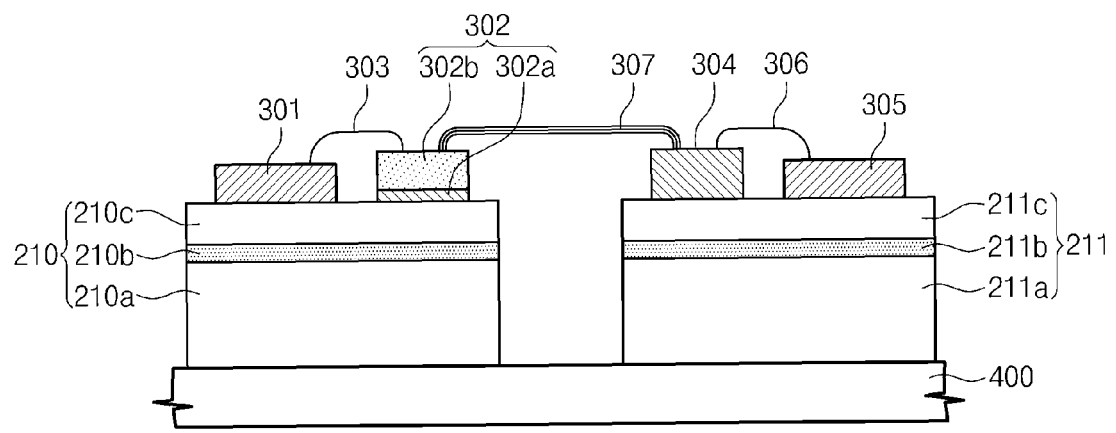
FIG. 2 is a schematic sectional view of a high-speed optical interconnection device according to another embodiment of the present invention.

FIG. 2 is a schematic sectional view of a high-speed optical interconnection device according to another embodiment of the present invention.

Referring to FIG. 2, a circuit board 400 is prepared. A first SOI substrate 210 and a second SOI substrate 211 are spaced apart from each other on the circuit board 400. The first SOI substrate 210 includes a substrate 210a, an insulation layer 210b and a SOI layer 210c, which are stacked in sequence. Likewise, the second SOI substrate 211 includes a substrate 211a, an insulation layer 211b and a SOI layer 211c, which are stacked in sequence. The insulation layers 210b and 211b may be a silicon oxide layer. The first and second SOI substrates 210 and 211 can minimize performance degradation caused by a parasitic component of a silicon substrate. For example, the first and second SOI substrates 210 and 211 can minimize a parasitic capacitance and reduce power consumption.

A first semiconductor chip 301 is disposed on the first SOI substrate 210. A light emitter 302 is disposed on the first SOI substrate 210, and receives a electrical signal from the first semiconductor chip 301 to output a optical signal. The light emitter 302 may receive the electrical signal from the first semiconductor chip 301 through a first electrical interconnection 303. The light emitter 302 may be a plurality of light emitter. The first electrical interconnection 303 may be a plurality of electrical interconnection line. The light emitter 302 may be spaced apart from the first semiconductor chip 301.

The light emitter 302 may be an LED. The first semiconductor chip 301 may include a silicon-germanium bipolar transistor or a silicon bipolar transistor.

The silicon-germanium bipolar transistor or silicon bipolar transistor has excellent drivability so that it may serve as a driving circuit of the light emitter 302. That is, the silicon-germanium bipolar transistor or silicon bipolar transistor may act as a driving element of the light emitter 302 for outputting a optical signal, and particularly, it may act as a driving element of an LED because of its high driving current. The silicon-germanium bipolar transistor or the silicon bipolar transistor may be a plurality of transistor.

An optical detector 304 is disposed on the second SOI substrate 211, and receives the optical signal through a channel fiber 307, which is output from the light emitter 302. The optical detector 304 may convert the optical signal into the electrical signal. The channel fiber 307 can transmit a plurality of optical signals at a time. The channel fiber 307 can transmit a optical signal. The channel fiber 307 may transmit a plurality of optical signals at a time. The channel fiber 307 may use an optical fiber made of glass or silicon.

A second semiconductor chip 305 is disposed on the second SOI substrate 211, and receives the electrical signal from the optical detector 304. The second semiconductor chip 305 can receive the electrical signal from the optical detector 304 through a second electrical interconnection 306. The optical detector 304 may be a plurality of optical detector. The second electrical interconnection 306 may be a plurality of electrical interconnection line. The plurality of optical detector 304 can receive the multi-optical signals from the plurality of light emitter 302 through the multi-channel fiber 307. The second semiconductor chip 305 may be spaced apart from the optical detector 304.

The light emitter 302 includes an intermediate layer 302a and a group III-V compound semiconductor layer 302b on the intermediate layer 302a. A lattice constant of the intermediate layer 302a is greater than a lattice constant of the SOI layer 210c of the first SOI substrate 210, and smaller than a lattice constant of the III-V compound semiconductor layer 302b. For example, if a lattice constant of silicon in the SOI layer 210c of the first SOI substrate 210 is about 5.43 Å, and a lattice constant of GaAs in the III-V compound semiconductor layer 302b is about 5.65 Å, a lattice constant of the intermediate layer 302a may be an interim value between them. The intermediate layer 302a is provided for minimizing a strain due to the lattice mismatch between the first SOI substrate 210 and the III-V compound semiconductor layer 302b. The intermediate layer 302a may be a silicon-germanium layer. The intermediate layer 302a can minimize a lattice defect.

The optical detector 304 may include one of a silicon-germanium PIN photodiode, a silicon-germanium photodiode, a silicon photodiode, and a germanium photodiode. Accordingly, it is possible to minimize a lattice defect between the optical detector 304 and the second SOI substrate 211.

Figure 3:
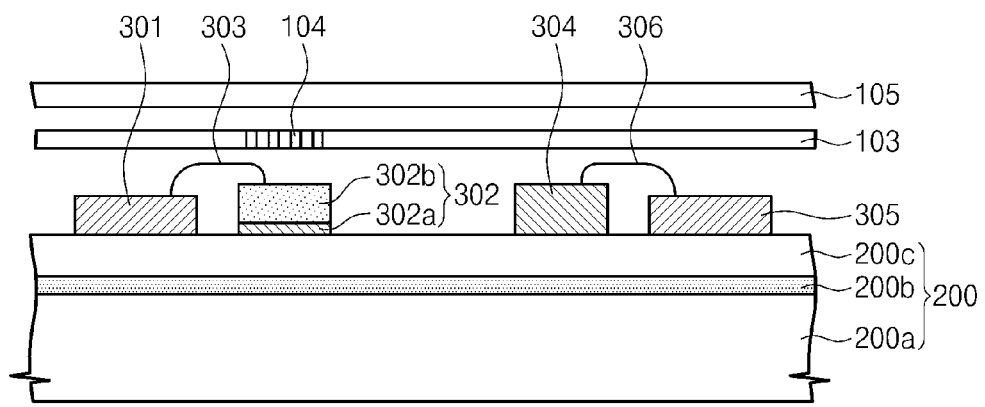
FIG. 3 is a schematic sectional view of a high-speed optical interconnection device according to a modification of the present invention.

FIG. 3 is a schematic sectional view of a high-speed optical interconnection device according to a modification of the present invention.

Referring to FIG. 3, a first semiconductor chip 301 is disposed on a SOI substrate 200. The SOI substrate 200 includes a substrate 200a, an insulation layer 200b and a SOI layer 200c, which are stacked in sequence. The SOI substrate 200 can minimize performance degradation caused by a parasitic component of a silicon substrate. For example, the SOI substrate 200 can minimize a parasitic capacitance and reduce power consumption. The insulation layer 200b may be a silicon oxide layer.

A light emitter 302 is disposed on the SOI substrate 200, and receives a electrical signal from the first semiconductor chip 301 to output a optical signal. The light emitter 302 may receive the electrical signal from the first semiconductor chip 301 through a first electrical interconnection 303. The light emitter 302 may be a plurality of light emitter. The first electrical interconnection 303 may be a plurality of electrical interconnection line. The light emitter 302 may be spaced apart from the first semiconductor chip 301.

The light emitter 302 may be an LED. The first semiconductor chip 301 may include a silicon-germanium bipolar transistor or a silicon bipolar transistor. The silicon-germanium bipolar transistor or silicon bipolar transistor has excellent drivability so that it may serve as a driving circuit of the light emitter 302. That is, the silicon-germanium bipolar transistor or silicon bipolar transistor may act as a driving element of the light emitter 302 for outputting a optical signal, and particularly, it may act as a driving element of an LED because of its high driving current. The silicon-germanium bipolar transistor or the silicon bipolar transistor may be a plurality of transistor.

An optical detector 304 is disposed on the SOI substrate 200, and receives the optical signal output from the light emitter 302. The optical detector 304 may convert the optical signal into the electrical signal. A second semiconductor chip 305 is provided to receive the electrical signal from the optical detector 304. The second semiconductor chip 305 can receive the electrical signal from the optical detector 304 through a second electrical interconnection 306. The optical detector 304 may be a plurality of optical detector. The second electrical interconnection 306 may be a plurality of electrical interconnection line. The second semiconductor chip 305 may be spaced apart from the optical detector 304.

The light emitter 302 includes an intermediate layer 302a and a group III-V compound semiconductor layer 302b on the intermediate layer 302a. A lattice constant of the intermediate layer 302a is greater than a lattice constant of the SOI layer 200c of the SOI substrate 200, and smaller than a lattice constant of the group III-V compound semiconductor layer 302b. For example, if a lattice constant of silicon in the SOI layer 200c of the SOI substrate 200 is about 5.43 Å, and a lattice constant of GaAs in the III-V compound semiconductor layer 302b is about 5.65 Å, a lattice constant of the intermediate layer 302a may be an intermediate value between them. The intermediate layer 302a is provided for minimizing a strain due to the lattice mismatch between the SOI substrate 200 and the III-V compound semiconductor layer 302b. The intermediate layer 302a may be a silicon-germanium layer. The intermediate layer 302a can minimize a lattice defect.

The optical detector 304 may include one of a silicon-germanium PIN photodiode, a silicon-germanium photodiode, a silicon photodiode, and a germanium photodiode. Accordingly, it is possible to minimize a lattice defect between the optical detector 304 and the SOI substrate 200.

A hologram optical substrate 103 is disposed over the light emitter 302. A mirror plate 105 is disposed over the hologram optical substrate 103. The hologram optical substrate 103 may include a hologram transmitter 104 configured to generate hologram using an optical signal output from the light emitter 302. The hologram transmitter 104 generates hologram using a plurality of optical signal outputs from the light emitter 302.

An optical path in the optical interconnection device according to this modification of the present invention is as follows. The light emitter 302 receives a electrical signal from the first semiconductor chip 301 disposed on the SOI substrate 200, and then outputs a optical signal. The optical signal passes through the hologram transmitter 104 provided in the hologram optical substrate 103 so that hologram is generated. The generated hologram is reflected by the mirror plate 105, and then incident onto the optical detector 304 disposed on the SOI substrate 200. The optical detector 304 receives the hologram reflected by the mirror plate 105, and converts the hologram into a electrical signal to output it to the second semiconductor chip 305.

Figure 4:
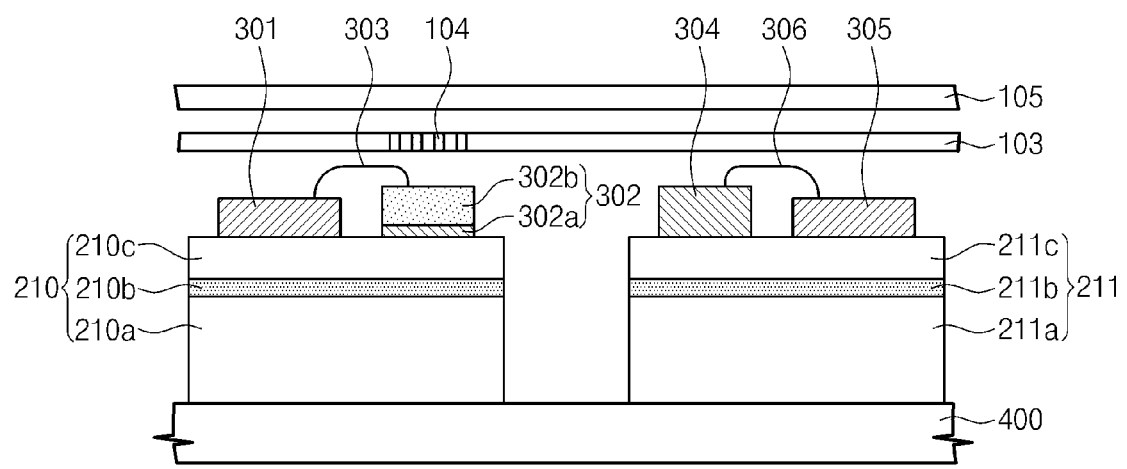
FIG. 4 is a schematic sectional view of a high-speed optical interconnection device according to another modification of the present invention.

FIG. 4 is a schematic sectional view of a high-speed optical interconnection device according to another modification of the present invention.

Referring to FIG. 4, a circuit board 400 is prepared. A first SOI substrate 210 and a second SOI substrate 211 are spaced apart from each other on the circuit board 400. The first SOI substrate 210 includes a substrate 210a, an insulation layer 210b and a SOI layer 210c, which are stacked in sequence. Likewise, the second SOI substrate 211 includes a substrate 211a, an insulation layer 211b and a SOI layer 211c, which are stacked in sequence. The insulation layers 210b and 211b may be a silicon oxide layer. The first and second SOI substrates 210 and 211 can minimize performance degradation caused by a parasitic component of a silicon substrate. For example, the first and second SOI substrates 210 and 211 can minimize a parasitic capacitance and reduce power consumption.

A first semiconductor chip 301 is disposed on the first SOI substrate 210. A light emitter 302 is disposed on the first SOI substrate 210, and receives a electrical signal from the first semiconductor chip 301 to output a optical signal. The light emitter 302 may receive a electrical signal from the first semiconductor chip 301 through a first electrical interconnection 303. The light emitter 302 may be a plurality of light emitter. The first electrical interconnection 303 may be a plurality of electrical interconnection line. The light emitter 302 may be spaced apart from the first semiconductor chip 301.

The light emitter 302 may be an LED. The first semiconductor chip 301 may include a silicon-germanium bipolar transistor or a silicon bipolar transistor. The silicon-germanium bipolar transistor or silicon bipolar transistor has excellent drivability so that it may serve as a driving circuit of the light emitter 302. That is, the silicon-germanium bipolar transistor or silicon bipolar transistor may act as a driving element of the light emitter 302 for outputting a optical signal, and particularly, it may act as a driving element of an LED because of its high driving current. The silicon-germanium bipolar transistor or the silicon bipolar transistor may be a plurality of transistor.

An optical detector 304 is disposed on the second SOI substrate 211, and receives the optical signal output from the light emitter 302. The optical detector 304 may convert the optical signal into the electrical signal. A second semiconductor chip 305 is disposed on the second SOI substrate 211, and receives the electrical signal from the optical detector 304. The second semiconductor chip 305 can receive the electrical signal from the optical detector 304 through a second electrical interconnection 306. The optical detector 304 may be a plurality of optical detector. The second electrical interconnection 306 may be a plurality of electrical interconnection line. The second semiconductor chip 305 may be spaced from the optical detector 304.

The light emitter 302 includes an intermediate layer 302a and a group III-V compound semiconductor layer 302b on the intermediate layer 302a. A lattice constant of the intermediate layer 302a is greater than a lattice constant of the SOI layer 210c of the first SOI substrate 210, and smaller than a lattice constant of the group III-V compound semiconductor layer 302b. For example, if a lattice constant of silicon in the SOI layer 210c of the first SOI substrate 210 is about 5.43 Å, and a lattice constant of GaAs in the III-V compound semiconductor layer 302b is about 5.65 Å, a lattice constant of the intermediate layer 302a may be an intermediate value between them. The intermediate layer 302a is provided for minimizing a strain due to the lattice mismatch between the first SOI substrate 210 and the III-V compound semiconductor layer 302b. The intermediate layer 302a may be a silicon-germanium layer. The intermediate layer 302a can minimize a lattice defect.

The optical detector 304 may include one of a silicon-germanium PIN photodiode, a silicon-germanium photodiode, a silicon photodiode, and a germanium photodiode. Accordingly, it is possible to minimize a lattice defect between the optical detector 304 and the second SOI substrate 211.

A hologram optical substrate 103 is disposed over the light emitter 302. A mirror plate 105 is disposed over the hologram optical substrate 103. The hologram optical substrate 103 may include a hologram transmitter 104 configured to generate hologram using an optical signal output from the light emitter 302. The hologram transmitter 104 generates hologram using optical signal outputs from the light emitter 302.

An optical path in the optical interconnection device according to this modification of the present invention is as follows. The light emitter 302 receives a electrical signal from the first semiconductor chip 301 on the first SOI substrate 210, and then outputs a optical signal. The optical signal passes through the hologram transmitter 104 provided in the hologram optical substrate 103 so that hologram is generated. The generated hologram is reflected by the mirror plate 105, and then incident onto the optical detector 304 disposed on second the SOI substrate 211. The optical detector 304 receives the hologram reflected by the mirror plate 105, and converts the hologram into a electrical signal to output it to the second semiconductor chip 305.

According to the embodiments of the present invention, the parasitic effect of a substrate can be minimized because the optical interconnection technology is applied to an SOI substrate instead of a silicon substrate. Furthermore, since multi-channel fibers are used, it is unnecessary to employ a serializer, a parallelizer, a modulator, etc., which makes it possible to realize a high-speed, small-sized, low-powered and low-priced optical interconnection device.

In addition, a light emitter on the SOI substrate includes an intermediate layer (silicon-germanium layer) and a group III-V compound semiconductor layer, thus minimizing lattice defects.

Moreover, a driving circuit employing a silicon-germanium bipolar transistor or silicon bipolar transistor with excellent drivability is provided on a transmission side, i.e., a first semiconductor chip on the SOI substrate, thereby making it possible to improve drivability.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A high speed optical interconnection device, comprising:
   a first silicon-on-insulator (SOI) substrate;
   a first semiconductor chip on the first SOI substrate;
   light emitters on the first SOI substrate, the light emitters receiving electrical signals from the first semiconductor chip to output optical signals;
   a second SOI substrate that is spaced apart from the first SOI substrate;
   optical detectors on the second SOI substrate, the optical detectors detecting the optical signals to convert the optical signals to electrical signals; and a second semiconductor chip on the SOI substrate, the second semiconductor chip receiving the electrical signals converted by the detectors.

2. The high-speed optical interconnection device of claim 1, further comprising a circuit board on which the first and second SOI substrates are placed.

3. The high-speed optical interconnection device of claim 1, wherein each of the light emitters comprises an intermediate layer on the SOI substrate, and a III-V compound semiconductor layer, and wherein a lattice constant of the intermediate layer is greater than a lattice constant of a silicon layer of the SOI substrate, and is smaller than a lattice constant of the III-V compound semiconductor layer.

4. The high-speed optical interconnection device of claim 1, wherein the intermediate layer comprises a silicon-germanium layer.

5. The high-speed optical interconnection device of claim 1, further comprising multi-channel fibers transmitting the optical signals from the light emitters to the optical detectors.

6. The high-speed optical interconnection device of claim 1, wherein the first semiconductor chip comprises silicon-germanium bipolar transistors or silicon bipolar transistors.

7. The high-speed optical interconnection device of claim 6, wherein each of the light emitters comprises a light-emitting diode (LED).

8. The high-speed optical interconnection device of claim 1, further comprising:
a hologram optical substrate disposed adjacent the light emitters; and
a mirror plate disposed adjacent the hologram optical substrate.

9. The high-speed optical interconnection device of claim 8, wherein the hologram optical substrate comprises a hologram transmitter configured to generate a hologram using the optical signals from the light emitters.

10. The high-speed optical interconnection device of claim 1, wherein each of the optical detectors is selected from the group consisting of a silicon-germanium positive intrinsic negative (PIN) photodiode, a silicon-germanium photodiode, a silicon photodiode, and a germanium photodiode.

* * * * *